United States Patent
Lee et al.

(10) Patent No.: US 9,557,611 B2
(45) Date of Patent: Jan. 31, 2017

(54) DISPLAY DEVICE AND MANUFACTURING METHOD THEREOF

(71) Applicant: Samsung Display Co., Ltd., Yongin, Gyeonggi-Do (KR)

(72) Inventors: Hee Keun Lee, Suwon-si (KR); Myeong Hee Kim, Yongin-si (KR); Han Joon Yoo, Seoul (KR); Dae Ho Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/712,664

(22) Filed: May 14, 2015

(65) Prior Publication Data
US 2016/0195744 A1 Jul. 7, 2016

(30) Foreign Application Priority Data

Jan. 7, 2015 (KR) ........................ 10-2015-0001985

(51) Int. Cl.
*G02F 1/1341* (2006.01)
*H01L 27/12* (2006.01)
*G02F 1/1368* (2006.01)
*G02F 1/1333* (2006.01)

(52) U.S. Cl.
CPC ........... *G02F 1/1341* (2013.01); *G02F 1/1368* (2013.01); *G02F 1/133377* (2013.01); *H01L 27/1214* (2013.01); *H01L 27/1259* (2013.01); *H01L 27/1262* (2013.01)

(58) Field of Classification Search
CPC .......... G02F 1/13; G02F 1/136; G02F 1/1362; G02F 1/136209; G02F 1/1341; G02F 1/133377; G02F 1/1368; G02F 1/1333; G02F 1/133345; G02F 1/133528; G02F 1/133305; G02F 1/133512; G02F 1/161; G02F 2001/133357; G02F 2201/08; G02F 2202/36
USPC ........ 349/189, 154, 153, 187, 138, 110, 158
See application file for complete search history.

(56) References Cited

U.S. PATENT DOCUMENTS

| | | | |
|---|---|---|---|
| 2013/0250220 A1* | 9/2013 | Kim ..................... | G02F 1/1341 349/123 |
| 2014/0247486 A1* | 9/2014 | Shibata ................ | G02B 1/04 359/488.01 |

FOREIGN PATENT DOCUMENTS

| | | |
|---|---|---|
| JP | 2001-183680 | 7/2001 |
| JP | 2008-033117 | 2/2008 |
| JP | 2008-242031 | 10/2008 |
| KR | 10-2002-0047748 | 6/2002 |
| KR | 10-2006-0080760 | 7/2006 |
| KR | 10-2008-0049193 | 6/2008 |
| KR | 10-2009-0103240 | 10/2009 |
| KR | 10-2011-0062992 | 6/2011 |
| KR | 10-2012-0026880 | 3/2012 |
| KR | 10-2013-0124827 | 11/2013 |
| KR | 10-2014-0007202 | 1/2014 |

* cited by examiner

*Primary Examiner* — Thoi Duong
(74) *Attorney, Agent, or Firm* — Innovation Counsel LLP

(57) ABSTRACT

An exemplary embodiment of the present inventive concept provides a liquid crystal display including: a substrate on which a thin film transistor is disposed; a pixel electrode disposed on the thin film transistor to be connected to the thin film transistor; a liquid crystal layer disposed on the pixel electrode and disposed within a microcavity having an injection hole; a roof layer disposed on the microcavity; and a capping layer disposed on the roof layer and around the injection hole, the capping layer including particles.

10 Claims, 18 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2015-0001985 filed in the Korean Intellectual Property Office on Jan. 7, 2015, the entire contents of which are incorporated herein by reference.

BACKGROUND (a) Technical Field

The present inventive concept relates to a display device and a manufacturing method thereof.

(b) Description of the Related Art

A liquid crystal display (LCD) is one of the most commonly used display devices. The liquid crystal display includes a liquid crystal display panel in which a liquid crystal layer is formed between a lower panel and an upper panel. A voltage is applied to a pixel electrode and a common electrode of the liquid crystal panel to generate an electric field such that an arrangement of liquid crystal molecules of the liquid crystal layer is realigned and the polarization of incident light is controlled, thereby displaying images.

The two panels of the liquid crystal display may be configured by the lower panel where thin film transistors are arranged and the upper panel facing the lower panel. In the lower panel, a gate line transmitting a gate signal, a data line transmitting a data signal, a thin film transistor connected to the gate line and the data line, and a pixel electrode connected to the thin film transistor are formed. In the upper substrate, a light blocking member, a color filter, and a common electrode may be formed, and at least one of them may be formed in the lower panel.

In general, in the liquid crystal display, two substrates are used for the lower panel and the upper panel, and processes for forming the above-described constituent elements in each substrate and combining the two panels are required. As a result, the liquid crystal panel is heavy and thick, cost of manufacturing the liquid crystal panel is high, and process time for manufacturing the liquid crystal panel is long. Recently, a technique in which a plurality of microcavities of a tunnel shape structure are formed on one substrate and the liquid crystal is injected inside the structure to manufacture the display device has been developed. When manufacturing the liquid crystal display, it is necessary to seal an injection hole of a microcavity for the liquid crystal not to be discharged from the microcavity after injecting the liquid crystal. In this case, the material sealing the injection hole inevitably contacts the liquid crystal near the injection hole such that the liquid crystal is contaminated, thereby generating a display quality deterioration such as a texture or a light leakage.

The above information disclosed in this Background section is only for enhancement of understanding of the background of the inventive concept and therefore it may contain information that does not form the prior art.

SUMMARY

The present inventive concept has been made in an effort to provide a liquid crystal display and a manufacturing method thereof, having advantages of being capable of preventing or minimizing contamination of a liquid crystal injected to a microcavity.

An exemplary embodiment of the present inventive concept provides a liquid crystal display including: a substrate on which a thin film transistor is disposed; a pixel electrode disposed on the thin film transistor to be connected to the thin film transistor; a liquid crystal layer disposed on the pixel electrode and disposed within a microcavity having an injection hole; a roof layer disposed on the microcavity; and a capping layer disposed on the roof layer and around the injection hole, the capping layer including particles.

The capping layer and the particles included in the capping layer may have the same refractive index.

The capping layer and the particles may be made of the same material.

The particles may be disposed around the injection hole and on the roof layer.

The particles may be disposed at a lower portion of the capping layer.

The particles may have a diameter that is in a range of about 3 micrometers to about 5 micrometers.

The particles may have a diameter larger than the height of the microcavity.

The particles may have the same diameter or two or more different diameters.

The particles may have a circular or elliptical shape.

The particles may be disposed around the injection hole, but may not be disposed on the roof layer, and the particles may be black particles which block light to pass through.

The liquid crystal display may further include a common electrode configured to generate an electric field together with the pixel electrode.

An exemplary embodiment of the present inventive concept provides a manufacturing method of a liquid crystal display, including: forming a thin film transistor on a substrate; forming a pixel electrode to be connected to the thin film transistor; forming a sacrificial layer on the pixel electrode; forming a roof layer on the sacrificial layer, the roof layer exposing a sacrificial layer in an injection hole formation region; forming a microcavity having an injection hole by removing the sacrificial layer; forming a liquid crystal layer within the microcavity by injecting a liquid crystal thereinto through the injection hole; scattering particles on the injection hole formation region and the roof layer; and forming a capping layer which covers the injection hole formation region and the roof layer by coating and curing a capping layer forming material.

The particles may have the same refractive index as that of the capping layer.

The particles may be made of the same material as that of the capping layer forming material.

The particles may have a diameter that is in a range of about 3 micrometers to about 5 micrometers.

The particles may have the same diameter or two or more different diameters.

The particles may have a circular or elliptical shape.

The manufacturing method may further include removing scattered particles on the roof layer before coating the capping layer forming material.

The particles may have a circular or elliptical shape.

The manufacturing method may further include removing scattered particles on the roof layer before coating the capping layer forming material.

The particles may be black particles which block light to pass through.

According to the exemplary embodiments of the present inventive concept, an area at which the capping layer forming material contacts the liquid crystal is reduced by the particles which are scattered before the capping layer is formed, thereby suppressing liquid crystal contamination caused by the capping layer forming material. Further, since the particles have the same refractive index as that of the capping layer, light characteristics are not deteriorated by the particles.

DETAILED DESCRIPTION OF THE EMBODIMENTS

Figure 1:
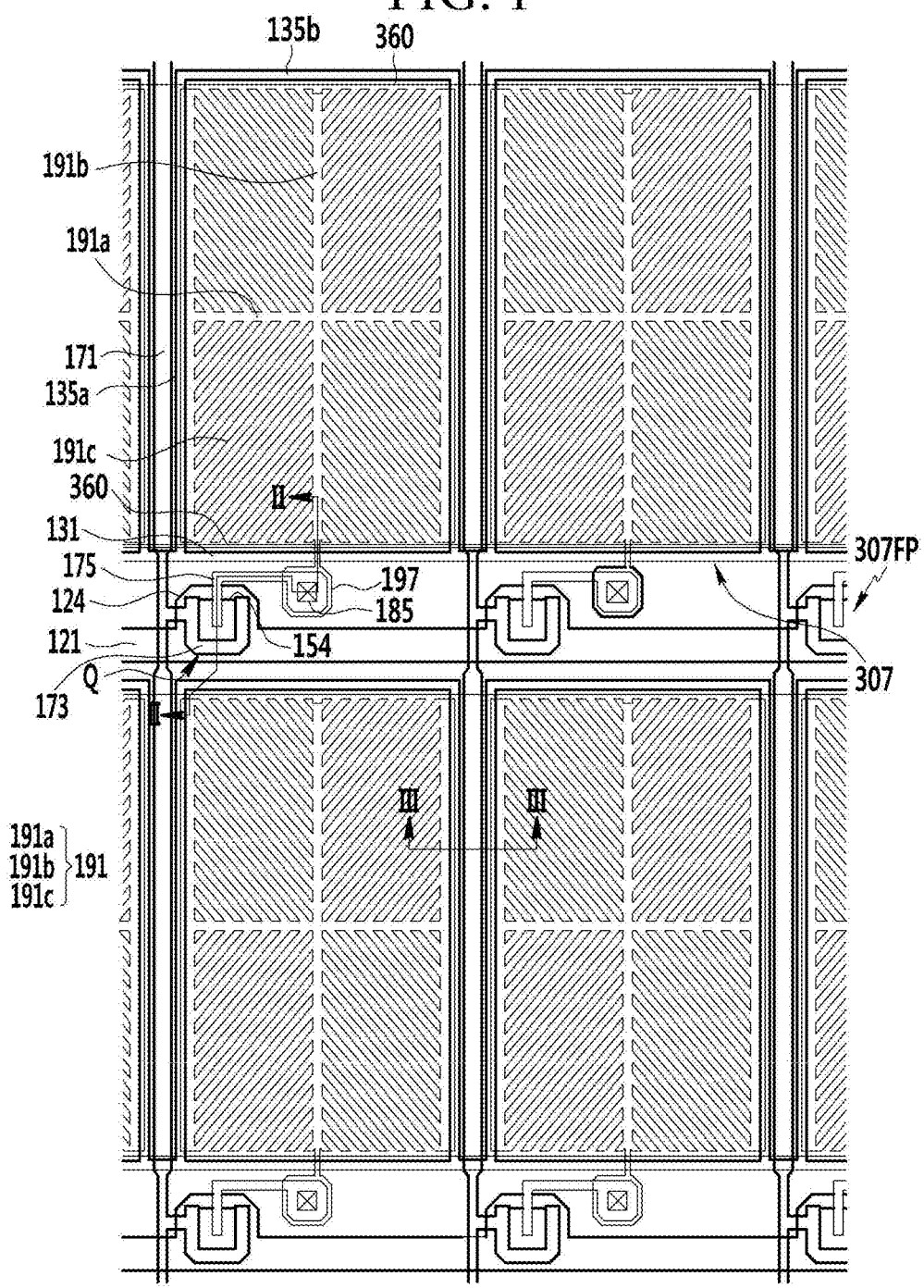
FIG. 1 is a top plan view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present between the element and the another element. In contrast, when an element is referred to as being "directly on" another element, there are no intervening elements present.

A liquid crystal display according to an exemplary embodiment of the present inventive concept will now be described with reference to the accompanying drawings.

Figure 2:
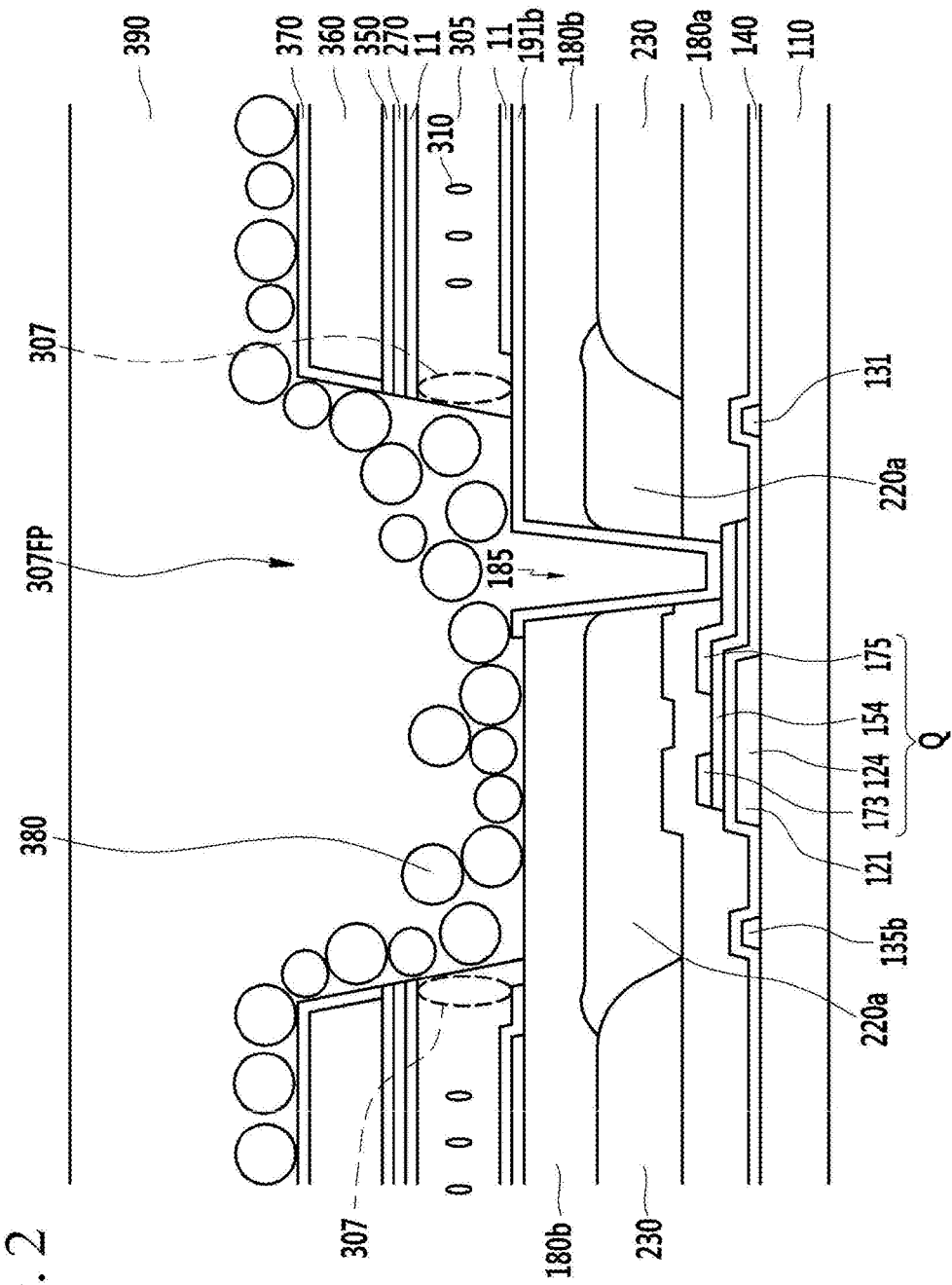
FIG. 2 is a cross-sectional view taken along a line II-II of FIG. 1.
Figure 3:
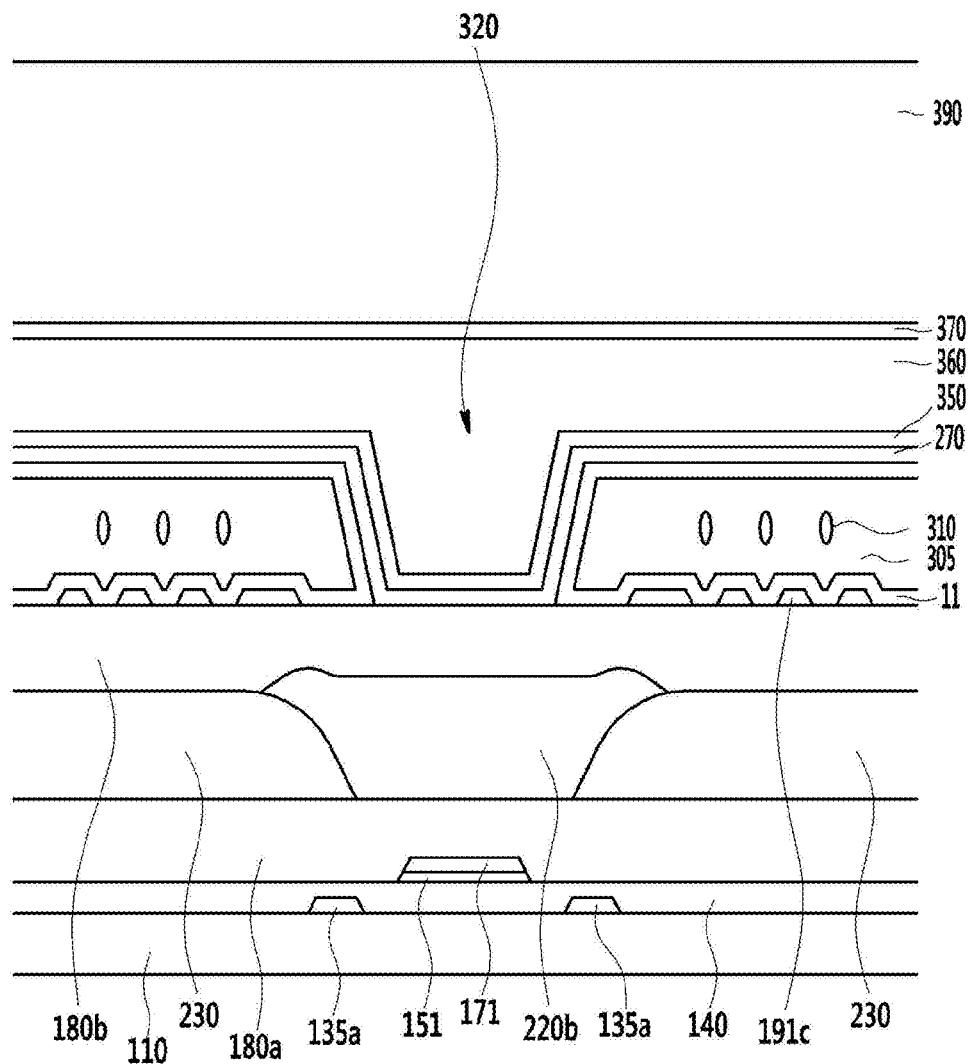
FIG. 3 is a cross-sectional view taken along a line III-III of FIG. 1.

FIG. 1 is a top plan view of a display device according to an exemplary embodiment of the present inventive concept, FIG. 2 is a cross-sectional view taken along a line II-II of FIG. 1, and FIG. 3 is a cross-sectional view taken along a line III-III of FIG. 1.

FIG. 1 illustrates four adjacent pixel areas among a plurality of pixels arranged in a matrix form.

Referring to FIG. 1 to FIG. 3, a gate conductor including a gate line 121 and a storage electrode line 131 is formed on a substrate 110 made of a transparent insulator such as glass or plastic.

The gate line 121 mainly extends in a horizontal direction to transmit a gate signal. The gate line 121 includes a gate electrode 124 protruding from the gate line 121. A protruding shape of the gate electrode 124 may be modified.

The storage electrode line 131 mainly extends in a horizontal direction to transfer a predetermined voltage such as a common voltage Vcom. The storage electrode line 131 includes a pair of vertical portions 135a extending to be substantially perpendicular to the gate line 121, and a horizontal portion 135b connecting ends of the pair of vertical portions 135a. The vertical portions 135a and the horizontal portion 135b of the storage electrode line 131 may substantially surround a pixel electrode 191.

A gate insulating layer 140 is formed on the gate line 121 and the storage electrode line 131. The gate insulating layer 140 may be made of an inorganic material such as a silicon nitride (SiNx) or a silicon oxide (SiOx). The gate insulating layer 140 may be formed as a single layer or a multilayer.

A semiconductor 151 and a semiconductor 154 are formed on the gate insulating layer 140 such that the semiconductor 151 is disposed below a data line 171, and the semiconductor 154 is disposed below source and drain electrodes and at a channel portion of a thin film transistor Q. The semiconductors 151 and 154 may be made of amorphous silicon, polycrystalline silicon, a metal oxide, and the like.

An ohmic contact (not illustrated) may be formed between the semiconductors 151 and 154 and the data line 171 and the source and drain electrodes. The ohmic contact may be made of a silicide or a material such as n+ hydrogenated amorphous silicon in which an n-type impurity is doped at a high concentration.

A data conductor including a source electrode 173, a drain electrode 175, and the data line 171 connected with the source electrode 173 is formed on the semiconductors 151 and 154 and the gate insulating layer 140.

The data line 171 serves to transfer a data signal and mainly extends in a vertical direction to cross the gate line 121. The source electrode 173 and the drain electrode 175 constitute a thin film transistor Q together with the gate electrode 124 and the semiconductor 154, and a channel of the thin film transistor Q is formed in the semiconductor 154 between the source electrode 173 and the drain electrode 175.

A first interlayer insulating layer 180a is formed on the data conductor (171, 173, and 175) and an exposed portion of the semiconductor 154. The first interlayer insulating layer 180a may include an inorganic material such as a silicon nitride (SiNx) or a silicon oxide (SiOx), or an organic material.

A color filter 230 and a light blocking member 220 are formed on the first interlayer insulating layer 180a.

The color filter 230 may display one of three primary colors such as red, green, and blue. However, it is not limited to the three primary colors such as red, green, and blue, and may display one of cyan, magenta, yellow, and white-based colors. The color filter 230 may be made of a material displaying different colors for every adjacent pixel.

The light blocking member 220a and 220b is formed in a lattice structure having an opening corresponding to a region displaying the image (i.e., a pixel area), and is made of a material that does not allow light to pass therethrough. The light blocking member 220a and 220b includes a horizontal light blocking member 220a formed along a direction parallel with the gate line 121, and a vertical light blocking member 220b formed along a direction parallel with the data line 171. The light blocking member 220a and 220b may be formed on an upper insulating layer 370 that will be described later.

A second interlayer insulating layer 180b is formed on the color filter 230 and the light blocking member 220 to cover the color filter 230 and the light blocking member 220. The second interlayer insulating layer 180b may include an inorganic insulator such as a silicon nitride (SiNx) and a silicon oxide (SiOx), or an organic insulator. When a step is generated due to a thickness difference between the color filter 230 and the light blocking member 220, the second insulating layer 180b includes the organic insulator to reduce or eliminate the step.

A contact hole 185 exposing the drain electrode 175 is formed in the light blocking member 220 and the interlayer insulating layers 180a and 180b.

The pixel electrode 191 is formed on the second interlayer insulating layer 180b. The pixel electrode 192 may be made of a transparent conductive material such as indium tin oxide (ITO) or indium zinc oxide (IZO).

An entire shape of the pixel electrode 191 may be substantially quadrangular. The pixel electrode 191 may include a cross-shaped stem having a horizontal stem 191a and a vertical stem 191b crossing the horizontal stem 191a. The pixel electrode 191 may be divided into four subregions by the horizontal stem 191a and the vertical stem 191b, and each subregion includes a plurality of minute branches 191c. The pixel electrode 191 may further include an outer stem which surrounds an outer circumference thereof.

The minute branches 191c of the pixel electrode 191 may form an angle of approximately 40° to 45° with the gate line 121 or the horizontal stem 191a. The minute branches 191c of two adjacent subregions may be orthogonal to each other. A width of the minute branches may be gradually increased, or a distance between the minute branches 191c may vary.

The pixel electrode 191 includes an extension 197 which is connected to a lower end of the vertical stem 191b and has a larger area than the vertical stem 191b. The pixel electrode 191 is physically and electrically connected to the drain electrode 175 through the contact hole 185 in the extension 197, to receive a data voltage from the drain electrode 175.

The foregoing description of the thin film transistor Q and the pixel electrode 191 is merely an example, and a structure of the thin film transistor and a design of the pixel electrode may be modified in order to improve side visibility.

An alignment layer 11 is formed on the pixel electrode 191 and below a common electrode 270. The alignment layer 11 may be a vertical alignment layer. The alignment layer 11 may include at least one of generally-used materials as a liquid crystal alignment layer, for example polyamic acid, polysiloxane, and/or polyimide. The alignment layer 11 may be a photo-alignment layer.

A microcavity 305 is formed between the pixel electrode 191 and the common electrode 270. The microcavity 305 indicates a space generated when a sacrificial layer to be described later is formed and then removed. The microcavity 305 may be formed in one pixel area, and may also be formed over two adjacent pixel areas. The microcavity 305 has an injection hole 307 for injecting a liquid crystal including liquid crystal molecules 310. A liquid crystal layer is formed inside the microcavity 305. The liquid crystal may be injected into the microcavity 305 through the injection hole 307 by using a capillary force. An alignment material forming the alignment layer 11 may also be injected into the microcavity 305 through the injection hole 307 before injecting the liquid crystal.

In the drawing, the injection hole 307 is respectively formed at facing edges of microcavities 305 which are adjacently formed in the vertical direction, but the injection hole 307 may be formed at one of the two facing edges.

A plurality of microcavities 305 are formed in a matrix shape. These microcavities 305 may be divided in a horizontal direction (x-axis direction) by a partition wall portion 320, and may be divided in a vertical direction (y-axis direction) by an injection hole formation region 307FP (also referred to as trenches). In other words, one microcavity 305 may be formed at a region that is defined by an adjacent partition wall portion 320 and an adjacent injection hole formation region 307FP. Each microcavity 305 may correspond to one or more pixel areas. The injection hole formation region 307FP includes a vicinity of the injection hole 307 which corresponds to an outside of the microcavity 305.

The common electrode 270 and a lower insulating layer 350 are sequentially disposed on the alignment layer 11. The common electrode 270 receives a common voltage and generates an electric field together with the pixel electrode 191, to which a data voltage is applied, to determine tilt directions of the liquid crystal molecules 310 positioned in the microcavity 305 between the two electrodes. The common electrode 270 constitutes a capacitor together with the pixel electrode 191 to maintain the applied voltage even after the thin film transistor is turned off. The lower insulating layer 350 may be formed of a silicon nitride (SiNx) or a silicon oxide (SiOx).

In the present exemplary embodiment, it is illustrated that the common electrode 270 is formed on the microcavity 305, but the common electrode 270 may be formed below the microcavity 305, thereby accomplishing liquid crystal driving according to a coplanar electrode (CE) mode.

A roof layer 360 is disposed on the lower insulating layer 350. The roof layer 360 plays a supporting role in forming the microcavity 305 which is a space formed between the pixel electrode 191 and the common electrode 270. The roof layer 360 may include a photoresist, or other organic materials. Alternatively, the roof layer 360 may be formed of a color filter.

The upper insulating layer 370 is disposed on the roof layer 360. The upper insulating layer 370 may contact an upper surface of the roof layer 360. The upper insulating layer 370 may be made of an inorganic insulating material such as a silicon nitride (SiNx) and a silicon oxide (SiOx). The upper insulating layer 370 serves to protect the roof layer 360 made of an organic material, and may be omitted.

A capping layer 390 is disposed on the upper insulating layer 370. The capping layer 390 may also be disposed at the injection hole formation region 307FP, which is a space formed between two microcavities 305 that are adjacent to each other in a vertical direction, and is formed to cover the liquid crystal injection hole 307 of the microcavity 305 that is exposed by the liquid crystal injection hole formation region 307FP. The capping layer 390 may be formed by coating and hardening a liquid capping layer forming material. The capping layer 390 may be formed as a multilayer such as a double layer and a triple layer. In the case that the upper insulating layer 370 is not provided, the capping layer 390 may be disposed on the roof layer 360.

The capping layer 390 may be formed as a multilayer such as a double layer and a triple layer. The double layer is configured by two layers made of different materials. The triple layer is configured by three layers, and materials of adjacent layers are different from each other. For example, the capping layer 390 may include a layer made of an organic insulating material and a layer made of an inorganic insulating material.

The capping layer 390 includes particles 380. In other words, the particles 380 are included within the capping layer 390. The particles 380 may have a spherical or elliptical shape, but may have any three-dimensional structural shape. The particles 380 may have a diameter that is in a range of several tens of micrometers or less, e.g., several micrometers in consideration of a height of the microcavity. The particles may have a diameter that is in a range of about 3 micrometers to about 5 micrometers which may be larger than the height of the microcavity as a nonrestrictive example, so that the particles may not come into the microcavity. The particles 380 included in the capping layer 390 may have the same diameters, but may have two or more different diameters.

The particles 380 may be mainly positioned below the capping layer 390. In the case that the capping layer 390 is formed as a multilayer, the particles 380 may be positioned at a lowermost layer of the capping layer 390. The particles 380 are positioned above the upper insulating layer 370 as well as at the injection hole formation region 307FP including the vicinity of the injection hole 307. According to another exemplary embodiment, the particles 380 may be positioned at the injection hole formation region 307FP, but may not be positioned on the upper insulating layer 370.

The particles 380 may be a transparent material having the same refractive index as that of the capping layer. Since the same materials indicate the same refractive indexes, the particles 380 may be made of the same material as the capping layer forming material. In the case of the same refractive indexes, although the particles 380 are positioned in the capping layer 390, light refraction or transmittance deterioration is not generated by the particles 380. As a result, the characteristics of light passing through the capping layer 390 are not changed by the particles 380.

The particles 380 may be scattered toward a corresponding surface before the capping layer 390 is formed after a liquid crystal is injected into the microcavity 305. As a result, the particles 380 may be included in the formed capping layer 390. The particles 380 serve to prevent the capping layer forming material from contacting the liquid crystal, and as a result, contamination of the liquid crystal caused by the capping layer forming material can be prevented or minimized.

A polarizer may be disposed on a top surface and a bottom surface of the liquid crystal display. The polarizer may include a first polarizer attached on a bottom surface of the substrate 110, and a second polarizer attached on a top surface of the capping layer 391, and polarization axes of the two polarizers may be perpendicular to or parallel with each other.

Referring to FIG. 3, the partition wall portion 320 is formed between horizontally neighboring microcavities 305. The partition wall portion 320 may extend along the data line 171, and may be covered by the capping layer 390. The lower insulating layer 350, the common electrode 270, the upper insulating layer 370, and the roof layer 360 are formed in the partition wall portion 320, and this structure forms a partition wall to partition or define the microcavity 305. In the case of using such a partition wall structure including the partition wall portion 320, although the substrate 110 is bent, less stress can be generated and the change in a cell gap may be prevented.

An exemplary embodiment for manufacturing the aforementioned display device will now be described with reference to FIG. 4 to FIG. 16.

FIG. 4 to FIG. 16 are cross-sectional views of a manufacturing method of a liquid crystal display according to an exemplary embodiment of the present inventive concept. FIG. 4, FIG. 6, FIG. 8, FIG. 10, FIG. 11, FIG. 13, FIG. 15, and FIG. 16 sequentially illustrate the cross-sectional views taken along the line II-II of FIG. 1, and FIG. 5, FIG. 7, FIG. 9, FIG. 12, and FIG. 14 sequentially illustrates the cross-sectional views taken along the line III-III of FIG. 1.

Figure 4:
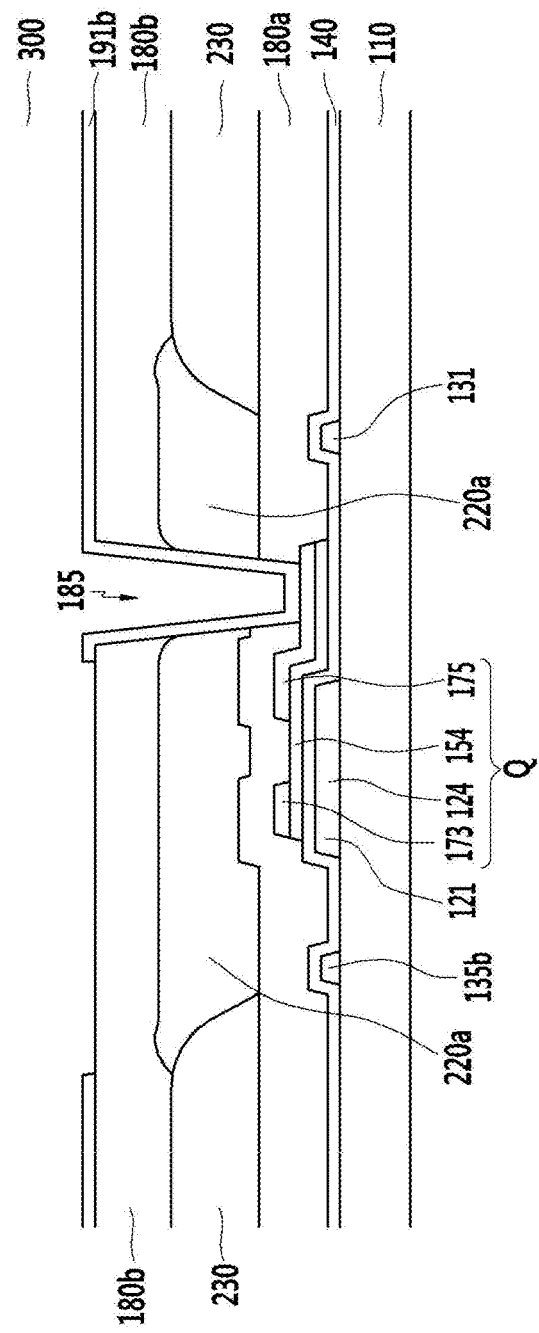
FIGS. 4, 5, 6, 7, 8, 9, 10, 11, 12, 13, 14, 15 and 16 are cross-sectional views showing a manufacturing method of a display device according to an exemplary embodiment of the present inventive concept.
Figure 5:
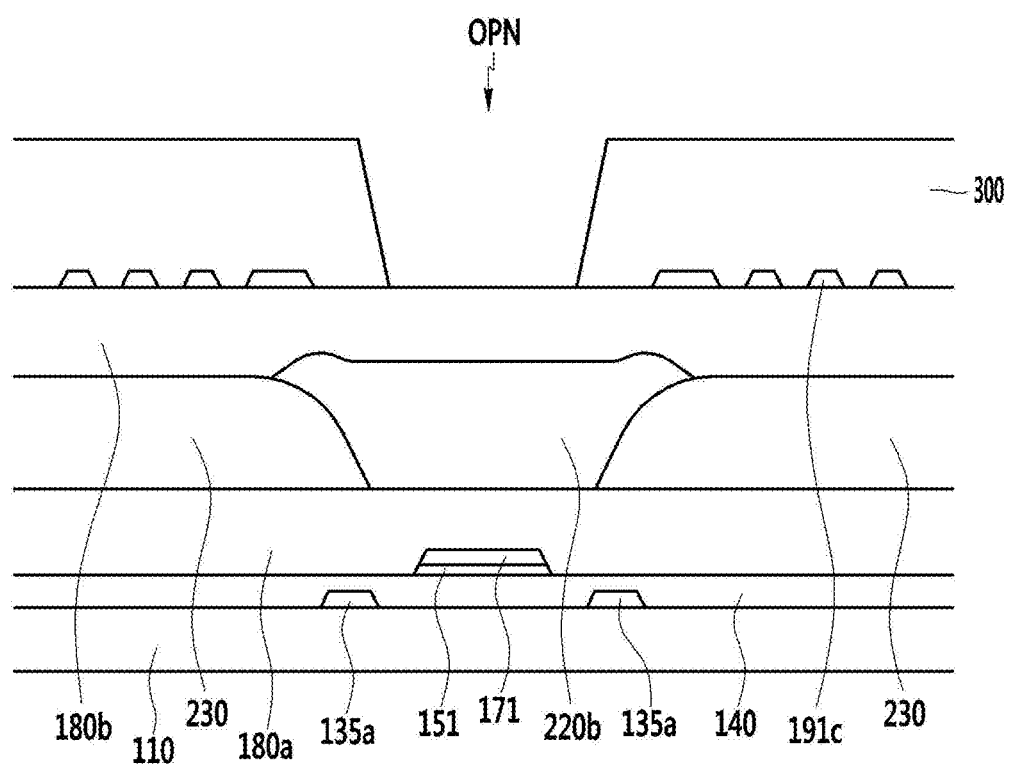

Referring to FIG. 1, FIG. 4 and FIG. 5, in order to form a generally known switching element on a substrate 110, the gate line 121 extending in the horizontal direction is formed, and the gate insulating layer 140 is formed on the gate line 121, the semiconductor layers 151 and 154 are formed on the gate insulating layer 140, and the source electrode 173 and the drain electrode 175 are formed. In this case, the data line 171 connected with the source electrode 173 may be formed to extend in the vertical direction while crossing the gate line 121. The storage electrode line 131 may also be formed when forming the gate line 121.

The first interlayer insulating layer 180a is formed on the data conductors 171, 173, and 175 including the source electrode 173, the drain electrode 175, and the data line 171, and the exposed portion of the semiconductor layer 154.

The color filter 230 is formed at the position corresponding to the pixel area on the first interlayer insulating layer 180a, and the light blocking member 220 is formed between the color filters 230. The color filter 230 is formed at the position corresponding to the pixel area on the first interlayer insulating layer 180a, and the light blocking member 220a and 220b is formed between the color filters 230.

The second interlayer insulating layer 180b covering the color filter 230 and the light blocking member 220a and 220b is formed thereon. The horizontal light blocking member 220a and the second interlayer insulating layer 180b have the contact hole 185 physically and electrically connecting the pixel electrode 191 and the drain electrode 175.

Next, the pixel electrode 191 is formed on the second interlayer insulating layer 180b, and a sacrificial layer 300 is formed on the pixel electrode 191. The pixel electrode 191 may be formed by depositing and patterning the transparent conductive material such as indium tin oxide (ITO) and indium zinc oxide (IZO). The sacrificial layer 300 may be formed by coating a photosensitive organic material on the pixel electrode 191 and patterning the photosensitive organic material using a photolithography process. As shown in FIG. 5, an opening OPN is formed on the sacrificial layer 300 along a direction parallel with the data line 171. In a subsequent process, the common electrode 270, the lower insulating layer 350, the roof layer 360, and the upper insulating layer 370 are formed in the open portion OPN to form the partition wall portion 320.

Figure 6:
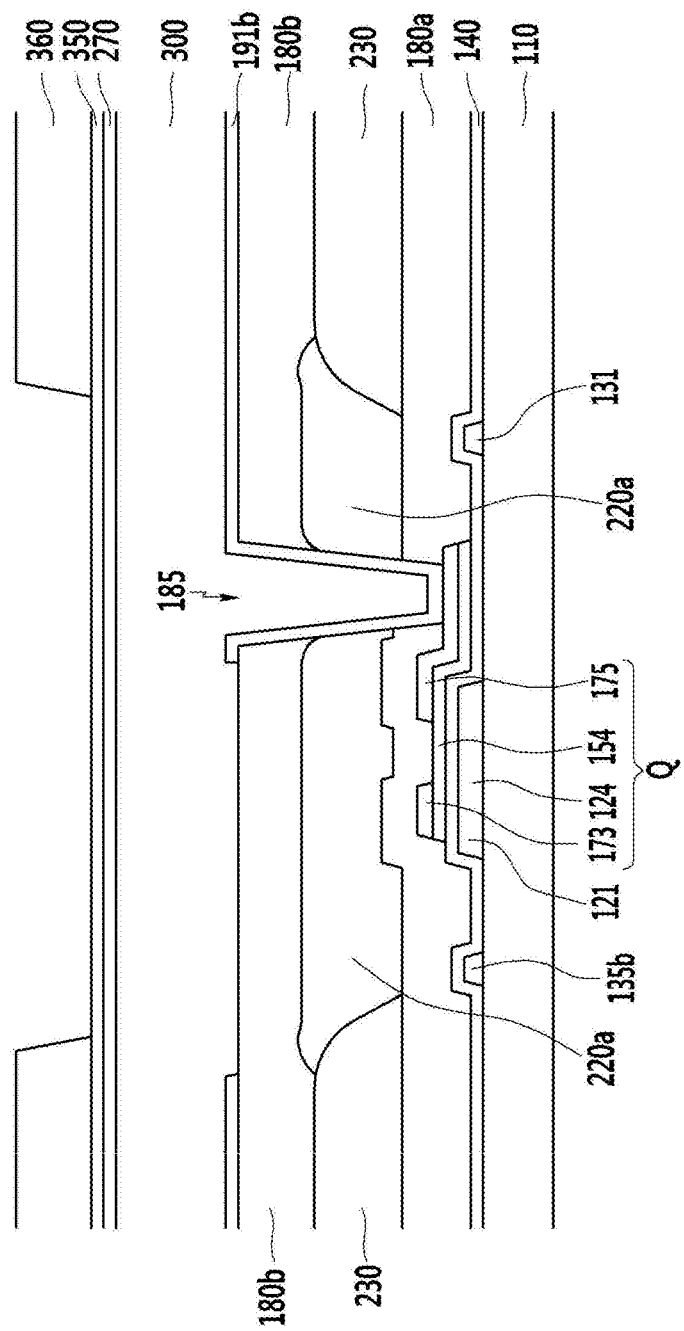
Figure 7:
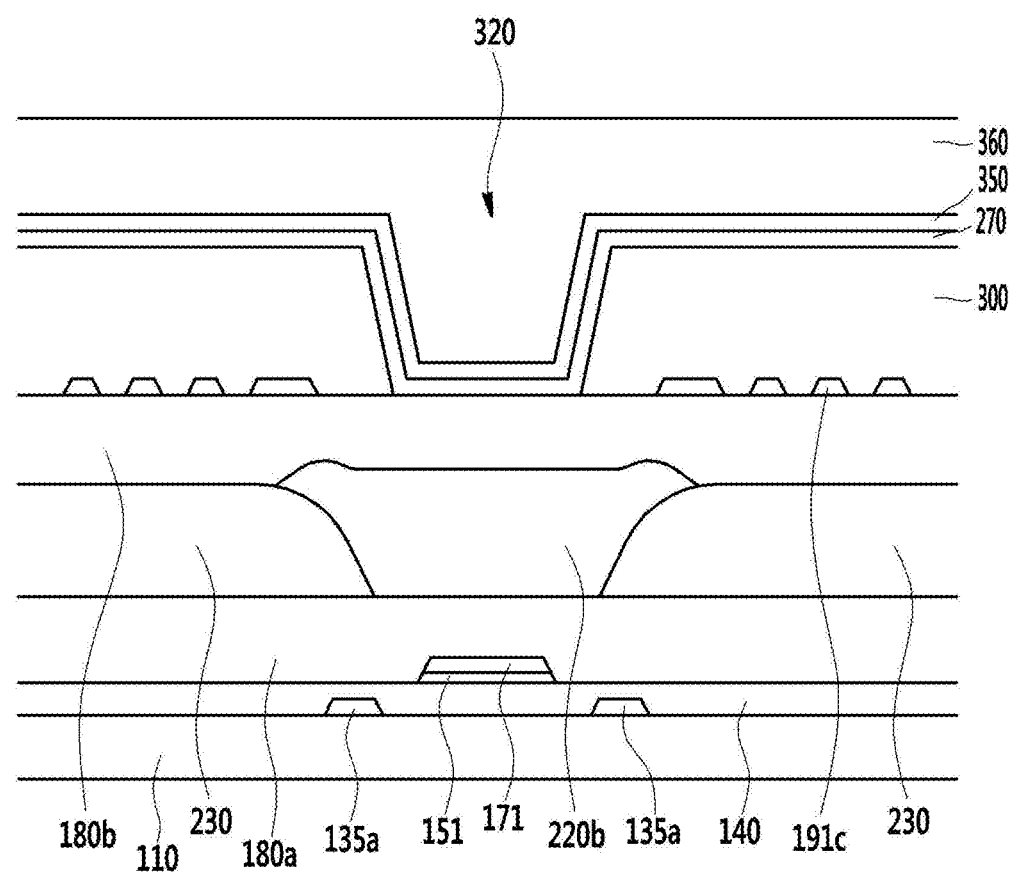

Referring to FIG. 6 and FIG. 7, the common electrode 270, the lower insulating layer 350, and the roof layer 360 are sequentially formed on the sacrificial layer 300. The roof layer 360 may be removed at the region corresponding to the light blocking member 220 positioned between the pixel areas adjacent in the vertical direction by an exposure and development process. The roof layer 360 exposes the lower insulating layer 350 in the region corresponding to the light blocking member 220. In this case, the common electrode 270, the lower insulating layer 350, and the roof layer 360 are formed in the open portion OPN of the longitudinal light blocking member 220b, thereby forming the partition wall portion 320.

Figure 8:
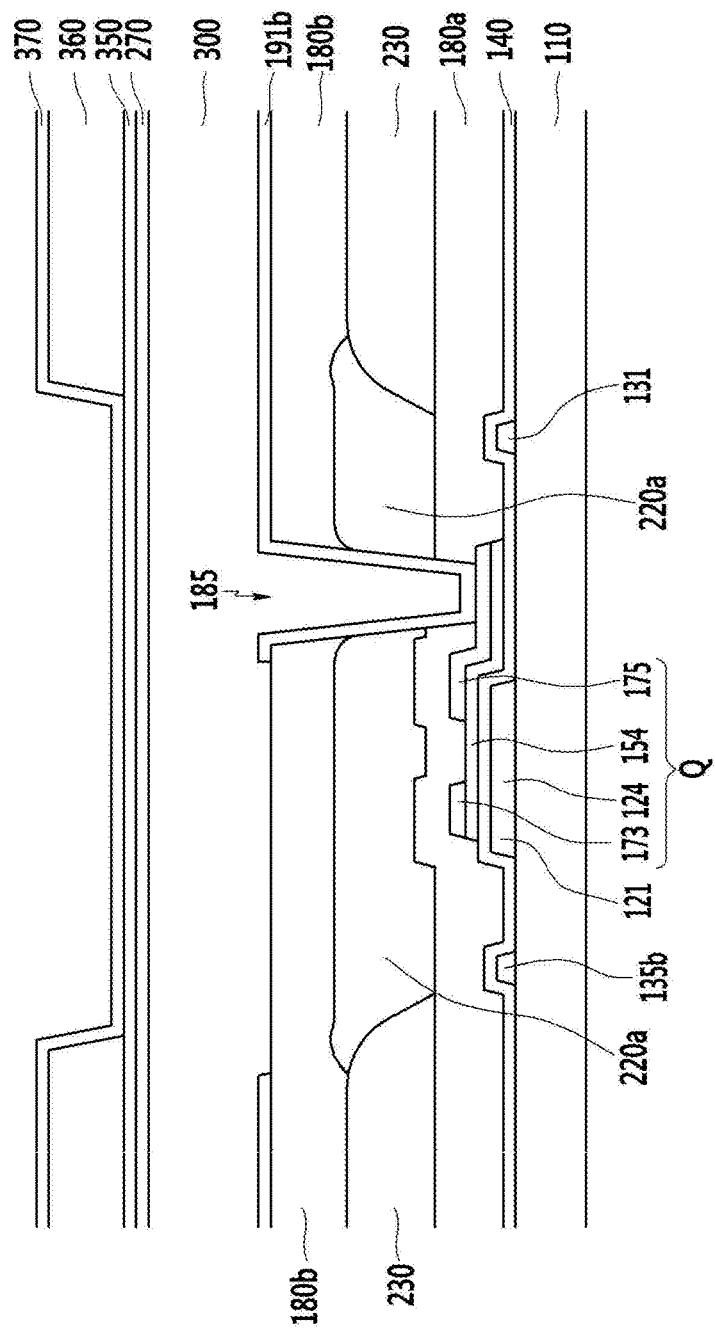
Figure 9:
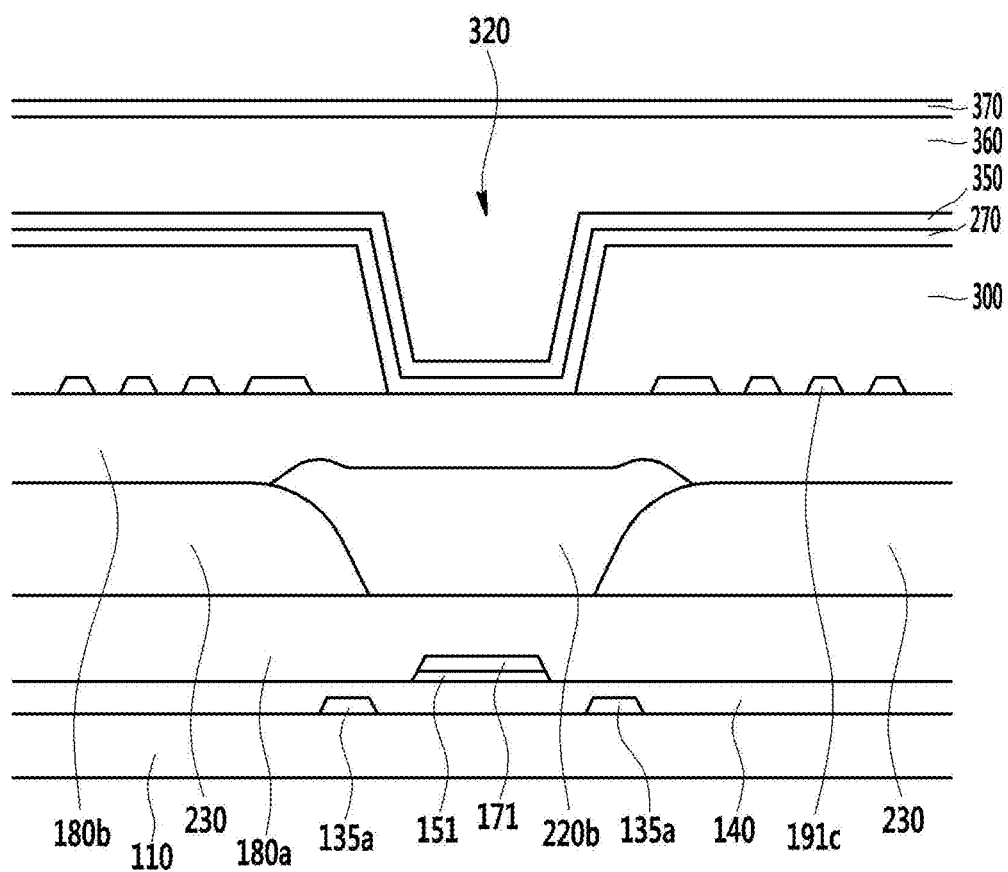

Referring to FIG. 8 and FIG. 9, the upper insulating layer 370 is formed in such a way so as to cover upper portions of the roof layer 360 and the exposed lower insulating layer 350.

Figure 10:
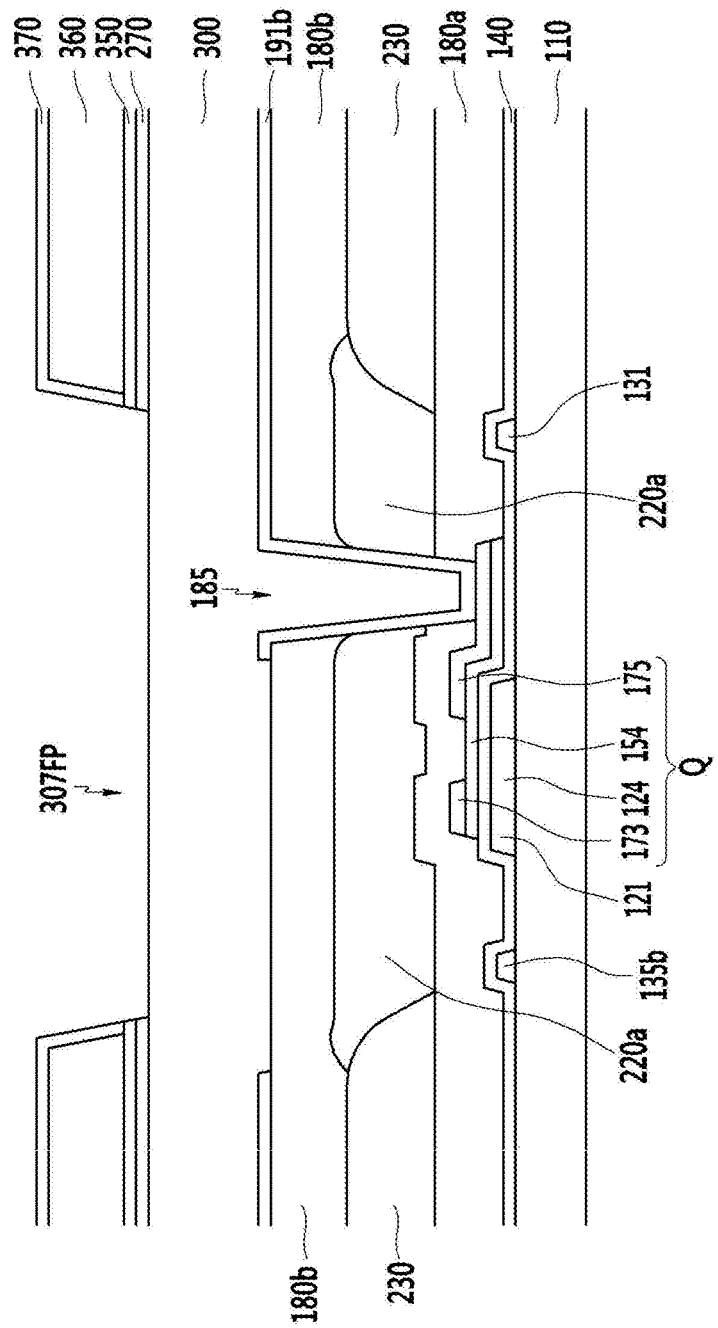

Referring to FIG. 10, the upper insulating layer 370, the lower insulating layer 350, and the common electrode 270 are dry-etched to partially remove the upper insulating layer 370, the lower insulating layer 350, and the common electrode 270, thereby forming the injection hole forming region 307FP. In this case, as shown in FIG. 10, the upper insulating layer 370 may be disposed to cover a side surface of the roof layer 360. Alternatively, the upper insulating layer 370 covering the side surface of the roof layer 360 may be removed so that the side surface of the roof layer 360 may be externally exposed.

Figure 11:
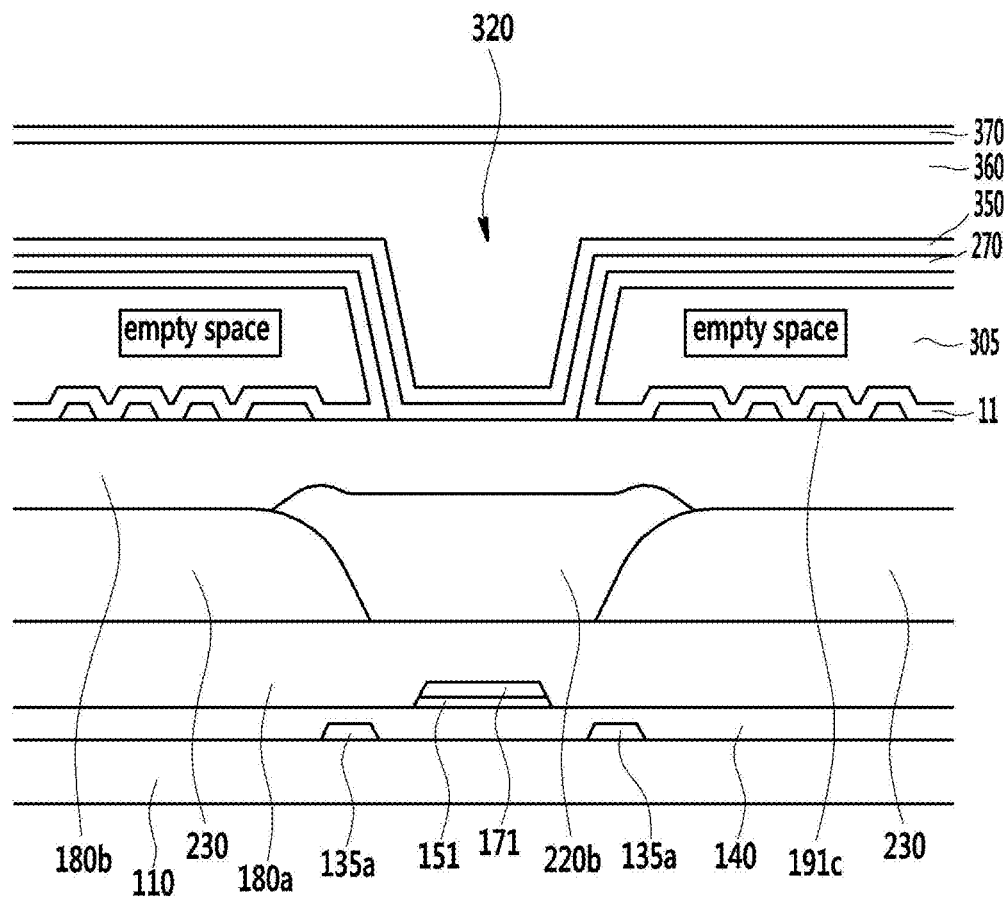
Figure 12:
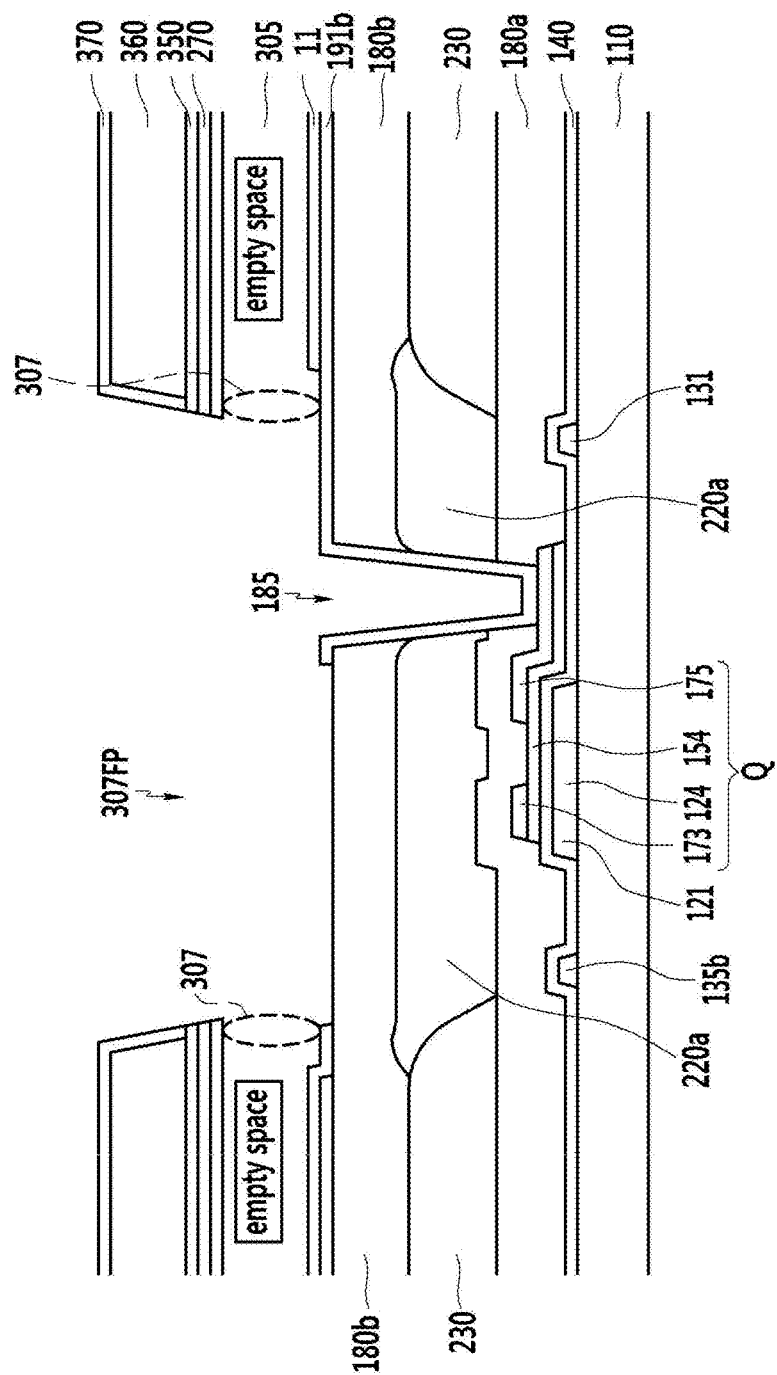

Referring to FIG. 11 and FIG. 12, the sacrificial layer 300 formed at the injection hole forming region 307FP and under the roof layer 360 is removed by an oxygen ($O_2$) ashing process or a wet-etching method. In this case, the microcavities 305 having the injection holes 307 are formed. The microcavities 305 are empty spaces that are formed by removing the sacrificial layer 300. To maintain the shape of the microcavity 305, a process of curing the roof layer 360 may be performed by heating. The process of curing the roof layer 360 may be performed just after forming the roof layer 360 on the sacrificial layer 300.

The alignment layer 11 is formed on the pixel electrode 191 and the common electrode 270 by injecting an alignment material into the microcavity 305 through the injection holes 307. In detail, when an aligning agent containing an alignment material is dripped on the substrate 110 by a spin coating method or an inkjet method, the aligning agent is injected into the microcavity 305 through the injection holes 307 by the capillary force. Next, as a curing process is performed, a solution component is evaporated and the alignment material remains at an inner wall of the microcavity 305, thereby forming the alignment layer 11.

Figure 13:
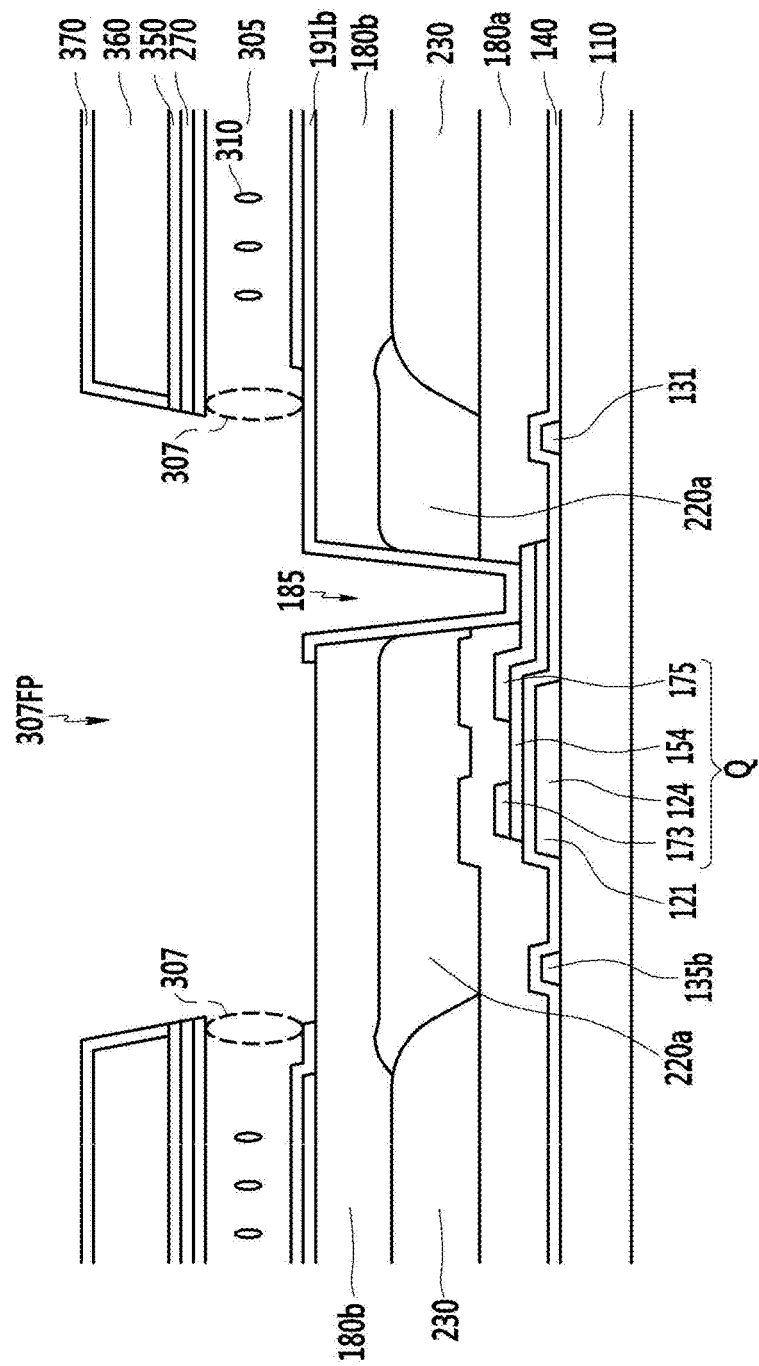
Figure 14:
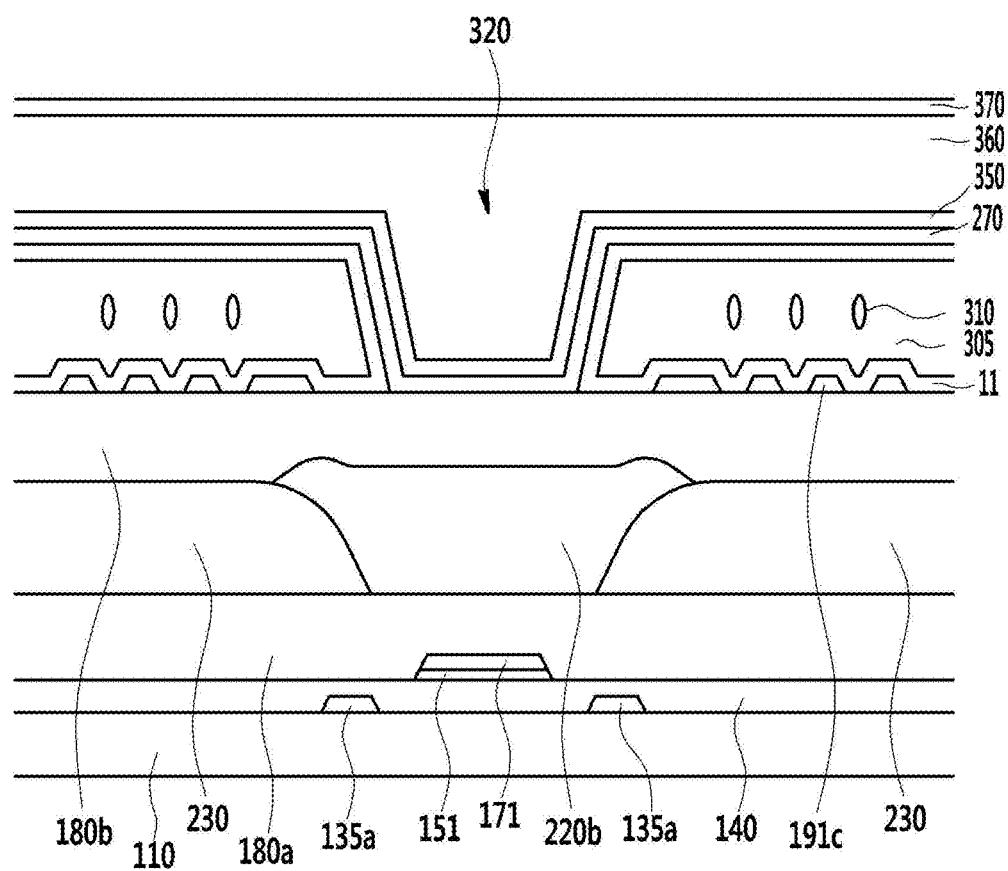

Next, referring to FIG. 13 and FIG. 14, a liquid crystal containing liquid crystal molecules 310 is injected into the microcavity 305 through the liquid crystal injection hole 307. When the liquid crystal is dripped on the substrate 110 by using, e.g., an inkjet method, the liquid crystal is injected into the microcavity 305 through the injection hole 307 by a capillary force. In this case, some of the liquid crystal which cannot be injected into the microcavity 305 may remain at the injection hole formation region 307FP. This remaining crystal is removed through a washing process, for example. However, a following process may be performed without removing the remaining liquid crystal.

Figure 15:
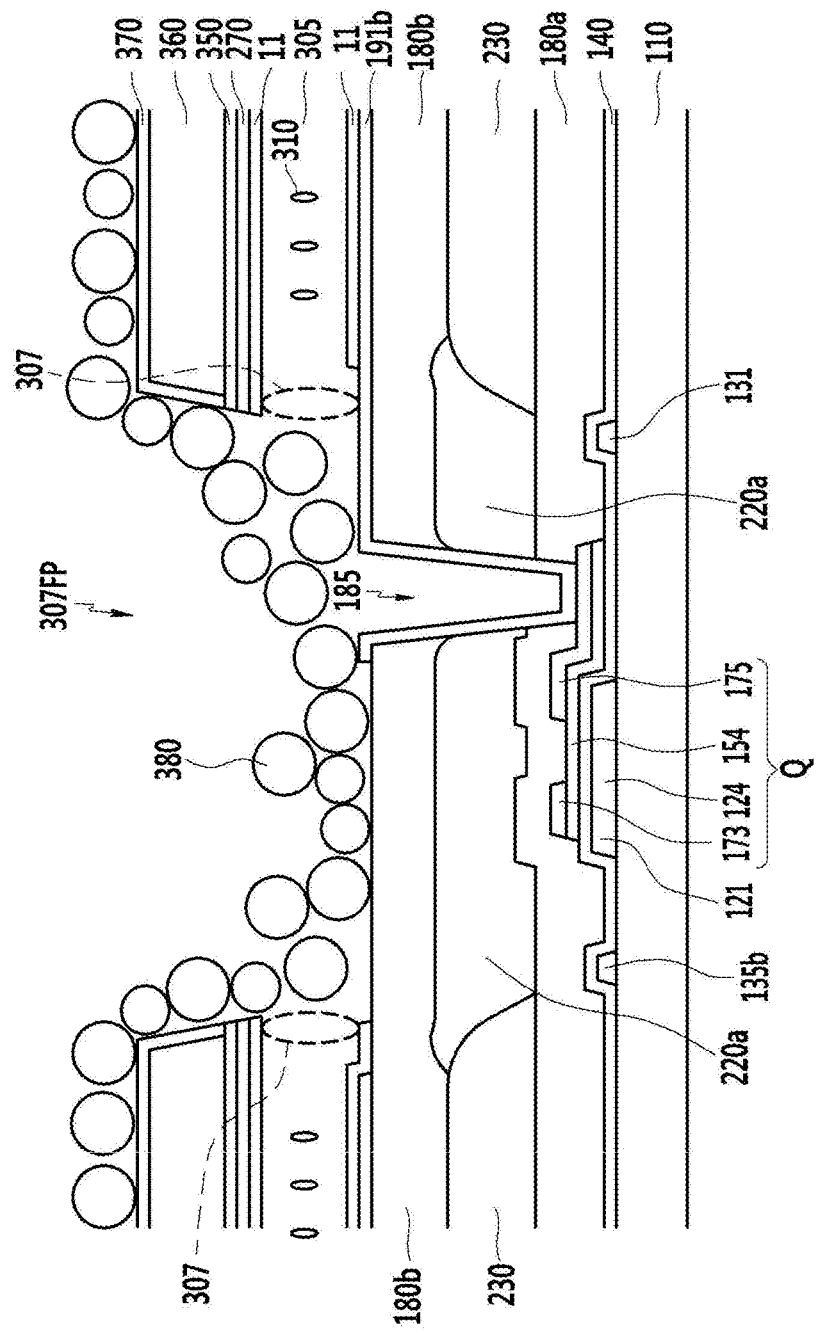

Referring to FIG. 15, a scattering step of the particles 380 is performed after the liquid crystal is injected. The particles 380 are in a solid state, and may have a diameter that is in a range of several micrometers. The particles 380 to be scattered may have the same diameter or two or more different diameters. The particles 380 may have substantially the same refractive index as that of the capping layer 390 which will be formed through a following process. For example, the particles 380 may be made of the same material as that of the capping layer forming material 390a, and may be obtained by curing a capping layer forming material into particles having a diameter that is in a range of several micrometers. Since the particles 380 are scattered on the substrate 110, the particles 380 may be scattered on an entire surface thereof to be positioned on the injection hole formation region 307FP and the roof layer 360 as illustrated in FIG. 15. The particles 380 may be exclusively positioned on the injection hole formation region 307FP by removing the particles 380 positioned on the roof layer 360 through a wiping process, for example. However, since the particles 380 according to the present exemplary embodiment have the same refractive index, no loss or refraction of light emitted through the pixel area is generated and optical characteristics are not deteriorated even when the particles 380 positioned on the roof layer 360 are not removed. This does not indicate that the removal of the particles 380 positioned on the roof layer 360 is excluded from the present inventive concept.

Figure 16:
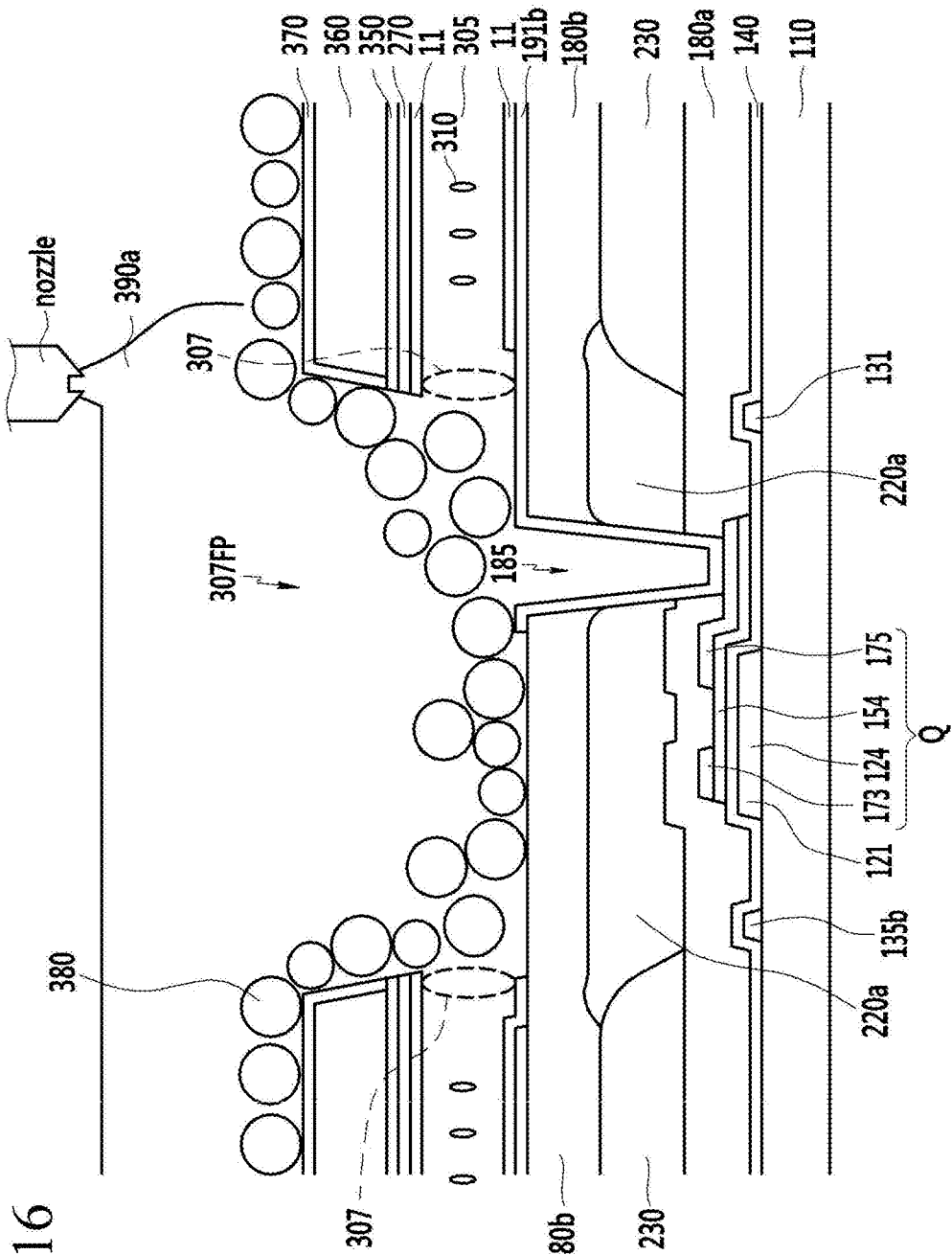

Referring to FIG. 16, a capping layer forming material 390a for forming the capping layer 390 is coated on the substrate 110 on which the particles 380 are scattered. The capping layer forming material 390a is in a liquid state, and may be coated by using a slit coater, for example. The coated capping layer forming material 390a covers the injection hole 307 and the injection hole formation region 307FP while filling gaps between the particles 380. Then, an ultraviolet and heat curing process is performed thereon to cure the coated capping layer forming material 390a. As a result, the capping layer 390 is formed in a state including the particles 380. In this case, the capping layer forming material 390a is coated on the scattered particles 380, and the particles 380 are mainly included at a lower portion of the capping layer 390.

In the meantime, since the particles 380 are scattered before the capping layer forming material 390a is coated and the scattered particles 380 are also positioned around the injection hole 307, according to the present exemplary embodiment, the capping layer forming material 390a has an area that contacts the liquid crystal around the injection hole 307, which is reduced due to the particles 380. In other words, the degree that the capping layer forming material 390a contacts the liquid crystal is reduced by as much as the degree that the particles 380 contact the liquid crystal. Accordingly, contamination of the liquid crystal generated when the capping layer forming material 390a contacts the liquid crystal can be reduced.

A material typically having a high viscosity (e.g., about 5000 cP or more) is employed as the capping layer forming material 390a, and thus it takes some time for the capping layer forming material 390a to penetrate between the particles 380 after being coated. This indicates that a certain amount of time can be obtained until the capping layer forming material 390a is coated and contacts the liquid crystal. Accordingly, a step of curing the capping layer forming material 390a may be completed before the capping layer forming material 390a contacts the liquid crystal around the injection hole 307 and reacts therewith, or this reaction is substantially performed. If the liquid capping layer forming material 390a is cured into a solid capping layer 390, no reaction is occurred even when the solid capping layer 390 contacts the liquid crystal. Accordingly, the contamination of the liquid crystal can be minimized by minimizing the time in which the capping layer forming material 390a contacts the liquid crystal before being cured.

In the meantime, unlike the exemplary embodiment of the present inventive concept, when a capping layer forming material is coated without scattering the particles 380 after the liquid crystal is injected, the capping layer forming material contacts the liquid crystal included in the microcavity 305 around the injection hole 307. Then, the capping layer forming material reacts with the liquid crystal at an interface of the liquid crystal before it is cured. As a result, the liquid crystal positioned around the injection hole 307 may lose a liquid crystalline phase, thereby leading to light leakage and afterimage generation. Further, a voltage holding ratio is reduced due to ions contaminated from the capping layer forming material. However, according to exemplary embodiment of the present inventive concept, since the particles 380 at least partially block a space between the capping layer forming material 390a and the liquid crystal, liquid crystal contamination can be reduced by reducing the area in which the capping layer forming material contacts the liquid crystal.

After the capping layer 390 is formed, a step of attaching a polarizer on a lower surface of the substrate 110 and the capping layer 390 may be performed.

Figure 17:
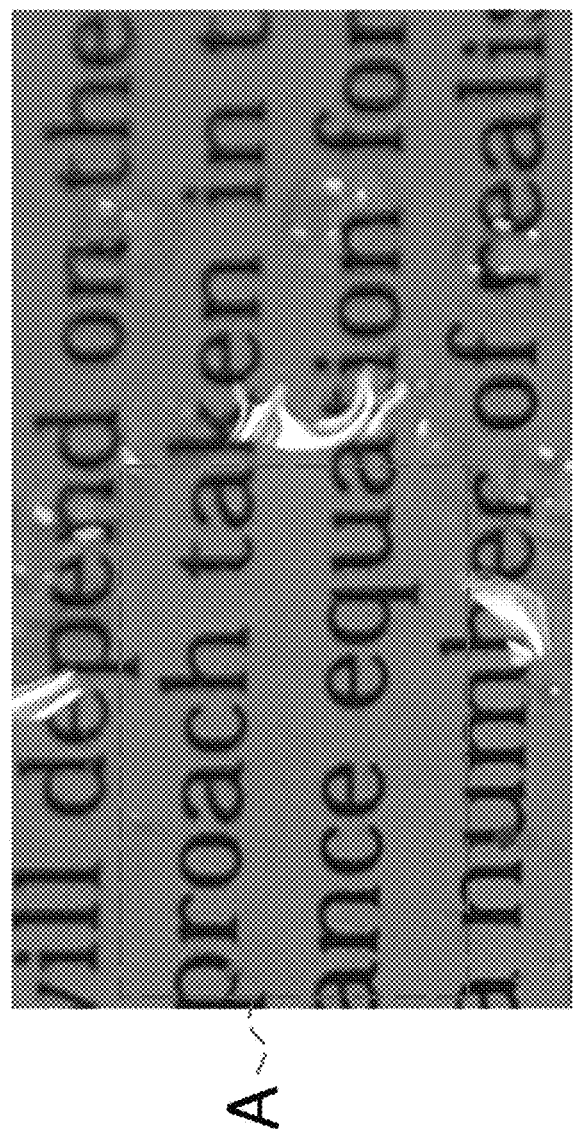
FIG. 17 illustrates an experimental result for showing an effect according to an exemplary embodiment of the present inventive concept.

FIG. 17 illustrates an experimental result for showing an effect according to an exemplary embodiment of the present inventive concept.

For an experiment, a plurality of hemispheres corresponding to the aforementioned particles were formed by dripping a capping layer forming material on a glass substrate and completely curing it. After curing the capping layer forming material on a glass substrate to form the plurality of hemispheres, the capping layer forming material was coated on the plurality of hemispheres and the capping layer forming material was cured. The plurality of hemispheres within a coated layer were not observed. This indicates that no problem in transmittance is generated by the particles positioned in the capping layer. As a result of observing a product after the product was put on a document, characters were not distorted at a portion at which a coated layer was formed (i.e., a region A in FIG. 7). If the particles have the same refractive index as that of the capping layer, this indicates light refraction or light loss is not generated even though particles exist in the capping layer.

Hereinafter, another exemplary embodiment of the present inventive concept will be described with reference to FIG. 18.

Figure 18:
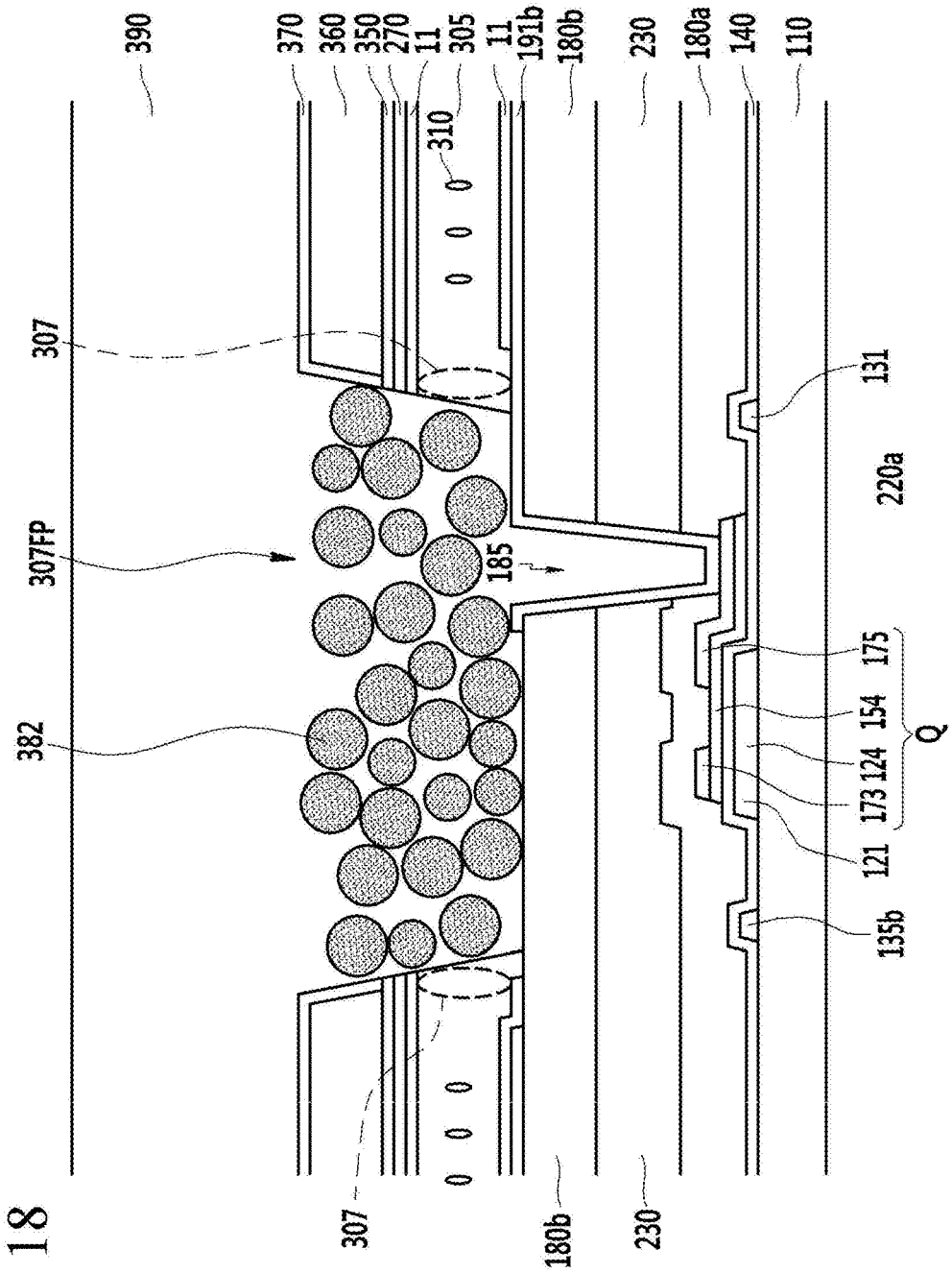
FIG. 18 illustrates a liquid crystal display according to an exemplary embodiment of the present inventive concept, corresponding to the cross-section taken along the line II-II of FIG. 1.

FIG. 18 illustrates a liquid crystal display according to an exemplary embodiment of the present inventive concept, corresponding to the cross-section taken along the line II-II of FIG. 1.

Unlike the aforementioned exemplary embodiment in which the capping layer 390 includes transparent particles having the same refractive index as that of the capping layer 390, a capping layer 390 includes black particles 382 positioned at the injection hole formation region 307FP. The black particles 382 may block light to pass through the black particles 382. The black particles 382 may pile up to a height of the roof layer 260, but the piling height is not limited thereto.

Similar to the aforementioned exemplary embodiment, the black particles 382 are scattered at the injection hole formation region 307FP before a capping layer is formed after a liquid crystal is injected, and thus an area at which the capping layer forming material contacts the liquid crystal is reduced, thereby serving to suppress contamination of the liquid crystal caused by the capping layer forming material. However, the black particles 382 that are positioned on the roof layer 360 instead of the injection hole formation region 307FP cause an aperture ratio or transmittance to deteriorate. Accordingly, the black particles 382 positioned on the roof layer 360 are removed through a wiping process, for example. Further, the black particles 382 may be made of a material that has no reactivity with the liquid crystal, or may be polymeric-coated in order to prevent liquid crystal contamination caused by the black particles 382.

As such, it is possible to block the light leakage or light reflection by using the black particles 382, and thus it is not required to form the light blocking member 220a shown in FIG. 2, for example.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A liquid crystal display comprising:
a substrate on which a thin film transistor is disposed;
a pixel electrode disposed on the thin film transistor to be connected to the thin film transistor;
a liquid crystal layer disposed on the pixel electrode and disposed within a microcavity having an injection hole;
a roof layer disposed on the microcavity; and
a capping layer disposed on the roof layer and around the injection hole, the capping layer including particles,
wherein a concentration of the particles disposed at a lower portion of the capping layer is higher than a concentration of the particles disposed at an upper portion of the capping layer.

2. The liquid crystal display of claim 1, wherein the capping layer and the particles have the same refractive index.

3. The liquid crystal display of claim 2, wherein the capping layer and the particles are made of the same material.

4. The liquid crystal display of claim 2, wherein the particles are disposed around the injection hole and on the roof layer.

5. The liquid crystal display of claim 1, wherein the particles have a diameter that is in a range of about 3 micrometers to about 5 micrometers.

6. The liquid crystal display of claim 1, wherein the particles have a diameter larger than the height of the microcavity.

7. The liquid crystal display of claim 1, wherein the particles have the same diameter or two or more different diameters.

8. The liquid crystal display of claim 1, wherein the particles have a circular or elliptical shape.

9. The liquid crystal display of claim 1, wherein the particles are disposed around the injection hole, but are not disposed on the roof layer, and
the particles are black particles which block light to pass through.

10. The liquid crystal display of claim 1, further comprising
a common electrode configured to generate an electric field together with the pixel electrode.

* * * * *